United States Patent
Hartmann

(10) Patent No.: US 7,454,662 B2
(45) Date of Patent: Nov. 18, 2008

(54) INTEGRATED MEMORY HAVING A CIRCUIT FOR TESTING THE OPERATION OF THE INTEGRATED MEMORY, AND METHOD FOR OPERATING THE INTEGRATED MEMORY

(75) Inventor: Udo Hartmann, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 720 days.

(21) Appl. No.: 10/917,339

(22) Filed: Aug. 13, 2004

(65) Prior Publication Data

US 2005/0039073 A1  Feb. 17, 2005

(30) Foreign Application Priority Data

Aug. 13, 2003  (DE) ............... 103 37 284

(51) Int. Cl.
*G06F 11/00*  (2006.01)
(52) U.S. Cl. .............. 714/42; 714/723
(58) Field of Classification Search ......... 714/42, 714/723
See application file for complete search history.

(56) References Cited

U.S. PATENT DOCUMENTS

| 5,588,115 | A | 12/1996 | Augarten |
| 6,359,820 | B2 | 3/2002 | Daehn et al. |
| 6,539,505 | B1 | 3/2003 | Dahn |
| 6,564,346 | B1 * | 5/2003 | Vollrath et al. ............ 714/723 |
| 6,775,796 | B2 * | 8/2004 | Finkler et al. ............ 714/723 |
| 6,842,874 | B1 * | 1/2005 | Voshell ............ 714/723 |
| 6,950,971 | B2 * | 9/2005 | Boehler et al. ............ 714/710 |
| 2002/0157049 | A1 * | 10/2002 | Kaiser et al. ............ 714/723 |
| 2003/0046621 | A1 * | 3/2003 | Finkler et al. ............ 714/723 |
| 2003/0084387 | A1 * | 5/2003 | Rooney et al. ............ 714/723 |

FOREIGN PATENT DOCUMENTS

WO  WO 98/03979 A1  1/1998

* cited by examiner

*Primary Examiner*—Michael C Maskulinski
(74) *Attorney, Agent, or Firm*—Edell, Shapiro & Finnan, LLC

(57) ABSTRACT

An integrated memory includes a circuit for testing the operation of the memory, a register circuit is used for storing a bit combination, compression unit, to receive test data which have been read from the memory cells, and a memory unit to store a plurality of bits from a compressed bit fail map. Each of the bits is associated with a different address region. One of the bits registers an error data item within the associated address region. In addition, a decoder circuit is provided for receiving the compressed address and for accessing that bit in the memory unit, which is associated with a respective address region on the basis of the compressed address. A short evaluation time for a function test on the memory and flexible alignment with the individual memory size are made possible.

11 Claims, 3 Drawing Sheets

INTEGRATED MEMORY HAVING A CIRCUIT FOR TESTING THE OPERATION OF THE INTEGRATED MEMORY, AND METHOD FOR OPERATING THE INTEGRATED MEMORY

CROSS REFERENCE TO RELATED APPLICATIONS

This application claims priority under 35 USC §119 to German Application No. DE 10337284.9, filed on Aug. 13, 2003, and titled "Integrated Memory Having a Circuit for Testing the Operation of the Integrated Memory, and Method for Operating the Integrated Memory," the entire contents of which are hereby incorporated by reference.

FIELD OF THE INVENTION

This invention relates to an integrated memory having a circuit for testing operation of the integrated memory, and to a method for operating such a memory.

BACKGROUND

For repairing faulty memory cells, integrated memories, such as "DRAMs" (Dynamic Random Access Memories), generally have redundant memory cells, which are usually combined to form redundant word lines or redundant bit lines in order to be able to replace regular word lines or bit lines containing faulty memory cells on an address basis. In this case, the integrated memory is tested, for example, using an external test device or a self-test device, and then the redundant elements are programmed using "redundancy analysis." A redundancy circuit has programmable elements, for example, in the form of programmable fuses, which are used to store the address of a line which is to be replaced.

A semiconductor memory chip is tested and then repaired after the fabrication process, for example. The addresses of those tested memory cells, which have been detected to be faulty, are stored in a "error address memory" so that, in a subsequent step, the stored addresses are used to replace these memory cells with working redundant memory cells. In this case, the memory chip is generally subject to a plurality of tests. Only those memory cells, which pass all of the tests, are deemed to be operational or working. If a memory cell does not pass one or more tests, it is deemed to be faulty and needs to be replaced with a working redundant memory cell.

From time to time, it is also normal practice, when testing the operation of memory chips, to store compressed images of the error distribution before the memory chips are repaired, in order to obtain a compressed "bit fail map." These images of the error distribution are used to analyze a process quality in the production process for a memory chip and to detect sources of error in production. In order to obtain a compressed bit fail map, the memory's matrix-like memory cell array is generally split into address regions, which each comprise a plurality of the memory cells. For each of these address regions, for example, a bit in the bit fail map is used to store whether the memory cells within this address region are working or whether at least one of these memory cells is faulty. Such address regions are divided by word line addresses and bit line addresses, for example. The background to such a practice is that only as many test data items should be generated as are needed to be able to check and identify a process quality for the production process and any sources of error. Too high a volume of test data causes unnecessary lengthening of the test time and thus increases the evaluation time for testing the operation of a memory chip and hence the fabrication costs for said memory chip.

It has often been normal practice, to date, to obtain data for checking the process quality and sources of error in the production process when evaluating the error address memory, i.e., "fail memory", which stores a map of the tested memory cells in the tested memory. Since such a fail memory is dependent on the size of the memory, comparatively large memories therefore have a large fail memory to be evaluated, which is associated with reading loops which are comparatively intensive in terms of test time and thus results in a long test time and evaluation time. One alternative to this would be merely to take random samples in order to keep the test time within acceptable limits.

To allow the fastest possible evaluation during testing, it is sometimes also current practice not to read the entire fail memory of the tester, but instead to provide a special smaller memory in the tester for this purpose, which undertakes this task automatically. During testing, this memory extracts a "compressed bit fail map" from the data written to the fail memory. The compressed bit fail map is obtained through prior division of the address space into address regions. This special memory has a fixed size and cannot be extended in testers today. Although the size of the memory chips fabricated today is increasing, there is no investment in new testers at the same rate. As a result, particularly, at the end of the period of use of a generation of testers, the special smaller memories are no longer sufficient for analysis. In such a case, data for checking the process quality and sources of error in the production process are instead being obtained when directly evaluating the fail memories.

SUMMARY

By specifying an integrated memory having a circuit for testing the operation of the integrated memory, a comparatively short test and evaluation time for particular evaluation operations for checking the process quality and sources of error in a production process is possible. At the same time, the flexible alignment with the continued development of memory chips is possible.

An integrated memory with a circuit for testing operation of the integrated memory includes a memory cell array having memory cells for storing test data. The integrated memory also has circuit components for reading the test data from the memory cells and circuit components for ascertaining addresses for the memory cells from which the test data have been read. In addition, the integrated memory has a compression module, which is connected to the circuit components for reading the test data from the memory cells, for receiving the test data from the memory cells. In this case, the compression module performs a nominal/actual data comparison with the received test data from the memory cells and produces an associated error data item at the output for a test data item from the test data from one of the memory cells, if one test data item from the test data from the one of the memory cells differs from a nominal data item which is associated with the one of the memory cells. Furthermore, the integrated memory has a register circuit for storing a bit combination, which can be used to divide an address space in the memory into address regions having a respective plurality of associated memory cells. The integrated memory can also include a compression unit, which can be actuated by the register circuit, for receiving error data, which have been produced by the output of the compression module. The compression unit generates a compressed address from the address of a received error data item from the error data. The compressed address flags an address for one of the address regions from which the test data item associated with the received error data item has been read. The compression unit also includes a memory unit for storing a plurality of bits. In this case, each of the bits is associated with one of the address regions. The bit associated with one of the address regions is set if the error data item produced by the compression module belongs to a test data item from the test data which is associated with the one of the address regions. Finally, the integrated memory also has a decoder circuit, which is connected to the compression unit and to the memory unit, for receiving the compressed address and for accessing that bit in the memory unit, which is associated with the respective address region based on the compressed address.

A relatively short test and evaluation time for particular evaluation operations for checking the process quality and sources of error in a production process is possible, since such particular evaluation operations do not require an entire failed memory in a test unit, from which the data for a late repair operation on the memory are obtained, to be read in order to be able to draw conclusions about process quality and sources of error in the production process. Rather, it is possible to provide a comparatively small error memory to which compressed data are written on the memory chip, when providing the memory unit. In particular, the memory unit is used to store a compressed bit fail map. Each of the bits in the compressed bit fail map is associated with a different address region, and one of the bits is able to register an error data item from a memory cell in the memory within the associated address region. In this context, the address space in the memory is divided into the individual address regions by the register circuit. The comparatively small memory unit (as compared with the fail memory) for storing the compressed bit fail map can be read and evaluated very quickly on account of the contrastingly smaller volume of data.

When providing the memory unit for storing the compressed bit fail map on the memory chip for each chip design, the size of the memory unit can be set so that flexible alignment with the individual size of the memory chip is possible. In comparison with providing a memory for storing the compressed bit fail map in a test unit, continued development of memory chips and the associated increase in the storage capacity of a memory chip does not require investment in new test units at the same rate. In addition, test units need not be designed for the longest possible period of use, which means that the costs for the test equipment can be reduced overall.

A long-term memory unit, which is connected to the memory unit, can provide long-term storage of the bits in the memory unit in corresponding bits in the long-term memory unit. In addition, an OR combinational logic circuit or a combinational logic circuit having the same effect is provided in order to combine each of the bits in the memory unit with a corresponding bit in the long-term memory unit. This embodiment of the invention makes it possible to store the compressed bit fail map stored in the memory unit over a plurality of test passes for a relatively long period of time in accumulated form without this involving information about error data from previous test passes being lost. In particular, the combinational logic circuit ensures that the information in each of the bits is retained as soon as the respective bit is set as a result of a registered error data item.

A counter circuit, which is connected to the memory unit and can be read to the outside, can count the number of those bits in the memory unit which flag an error data item. In comparison with reading the memory unit for storing the compressed bit fail map, when evaluating a function test using the counter circuit, the counter circuit counter is read needs to be read and just this information allows conclusions about process quality and sources of error in a production process. As a result, evaluating a function test is relatively faster.

A further counter circuit, which is connected to the long-term memory unit in a similar manner and can be read to the outside, can count the number of those bits in the long-term memory unit which flag an error data item. The further counter circuit can be evaluated relatively more quickly than the long-term memory unit.

BRIEF DESCRIPTION OF FIGURES

The invention is explained in more detail below with reference to the figures which are shown in the drawing and which represent exemplary embodiments of the present invention.

DETAILED DESCRIPTION

Figure 1:
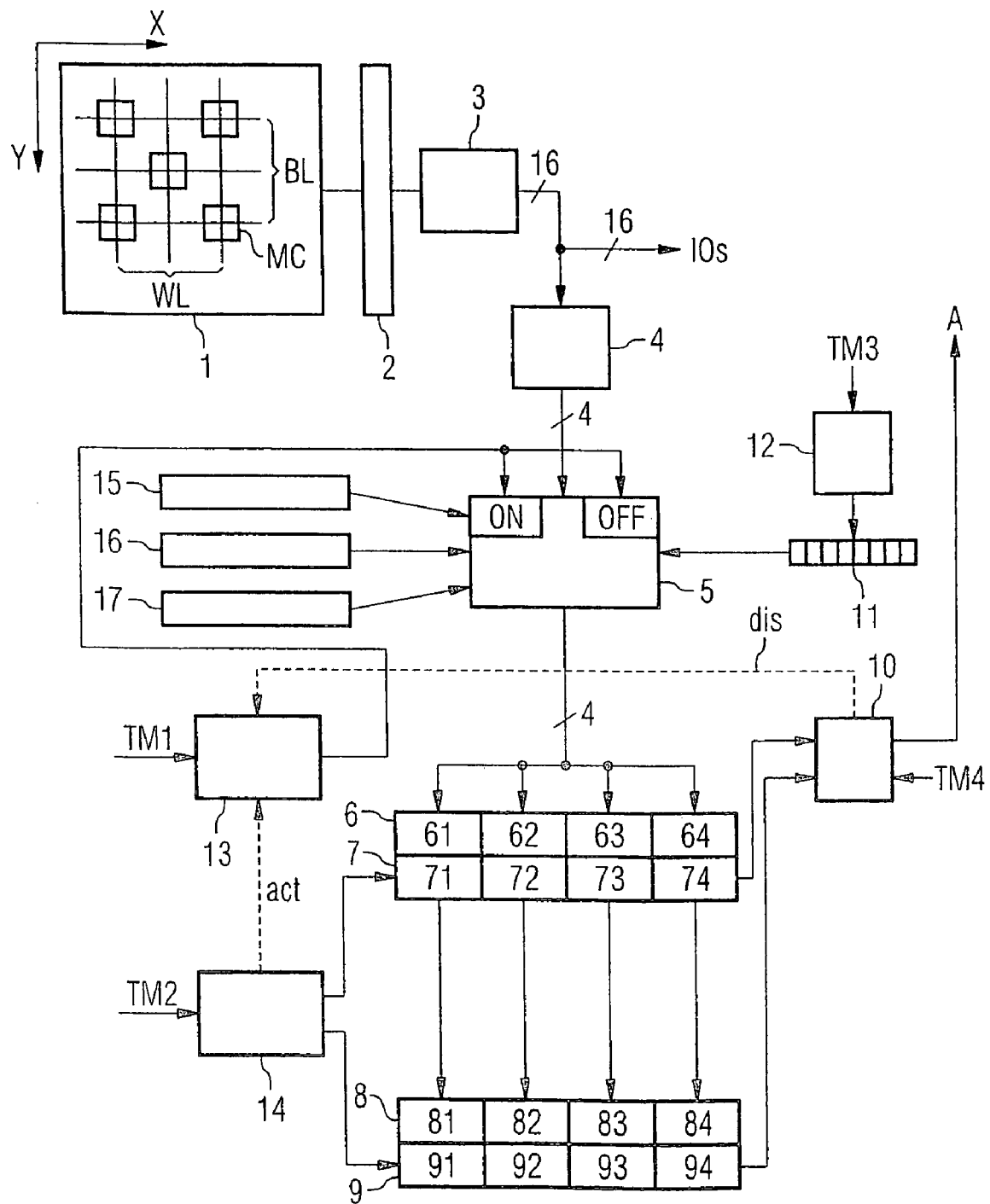
FIG. 1 shows a first embodiment of an integrated memory based on the invention with a circuit for testing the operation of the memory.

FIG. 1 shows a schematic view of a first embodiment of an integrated memory based on the invention with a circuit for testing the operation of the memory. The memory has a memory cell array 1 including word lines WL and bit lines BL in a matrix-like arrangement. The memory cells MC are arranged at crossover points between the word lines WL and bit lines BL. The memory cells MC, respectively, include a storage capacitor and a selection transistor, which, in normal circuitry, are connected to the word lines WL and bit lines BL. To read the memory cells MC, data signals from the respective memory cells are assessed and amplified by a sense amplifier 2, which is connected to an output register 3 for externally reading the data. In a normal mode in the memory, the output register 3 is connected to the external data ports IO of the memory, for example 16 IO ports being provided.

To test the operation of the memory cell array 1, the test data, which are output by the output register 3, are forwarded to an IO compression module 4. This undertakes the task of performing a nominal/actual data comparison and of compressing this information on four lines. This means that the information from four respective IO ports is combined to produce one information item. With regard to later repair of the memory, however, this does not mean loss of information, since in practice, a plurality of IO ports are often repaired together as a group, i.e., in the present example, four IO ports. Hence, further evaluation in relation to repair requires the information that at least one of the IO ports from this group has transmitted an erroneous data item, which initiates repair of the memory in relation to the entire IO port group. This reduces the error memory to one quarter of the size which would otherwise be required, if the error data from the IO ports were to be recorded individually.

The output data from the IO compression module 4 are forwarded to the compression unit 5, which receives the memory's compressed test data which have been read from the memory cell array 1. If an error data item is present, the compression unit 5 uses the row address multiplexer 15 already provided on the memory, the memory bank controller 16 and the column decoder 17 to generate a compressed address from the address of a received test data item. To this end, the compression unit 5 is actuated by the register circuit 11, which stores a bit combination which can be used to divide the address space in the memory into individual address regions having a respective plurality of associated memory cells.

Figure 3:
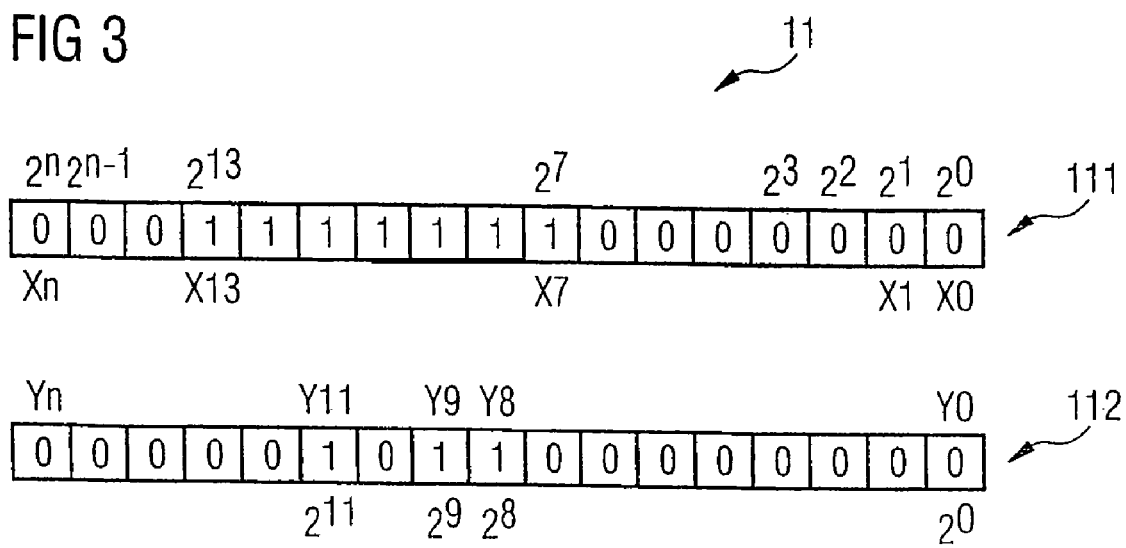
FIG. 3 shows an embodiment of a register circuit for storing a bit combination which can be used to divide an address space in the memory into individual address regions, and FIGS. 4A-4B schematically show an exemplary content of a fail memory and an exemplary associated compressed bit fail map, respectively.

FIG. 3 shows an embodiment of such a register circuit 11 for storing a bit combination for dividing the address space into address regions. The registered circuit 11 has a row register 111 and a column register 112, which stores a respective bit combination for the row address or column address of the memory. The row register 111 is used to store the row address bits X0 to Xn, and the column register 112 is used to store the column address bits Y0 to Yn. For example, bits X7 to X13 in the row register 111 are assigned as "1", and in the column register 112 bits Y8, Y9 and Y11, for example, are assigned the "1." This means that the registered circuit 11 stores 10 "split bits" as a bit combination, which is used to divide the address space in the memory into individual address regions.

Under the actuation of the registered circuit 11, the compression unit 5 thus generates, from the address of a received test data item, a compressed address which flags an address for an address region from which the test data item has been read. A decoder circuit 6 is connected to the compression unit 5 and receives the compressed address for accessing the memory unit 7. The memory unit is used to store a plurality of bits. Each of the bits is associated with a different address region. One of the bits can register an error data item from a memory cell in the memory within the associated address region.

Figure 4A:
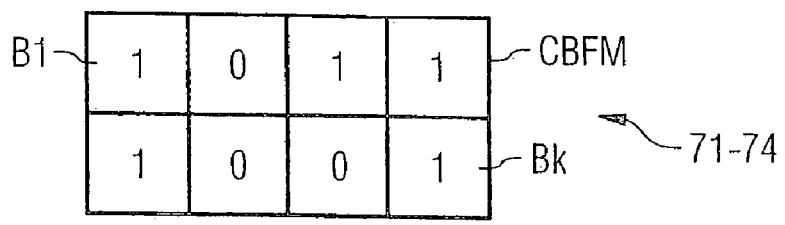
Figure 4B:
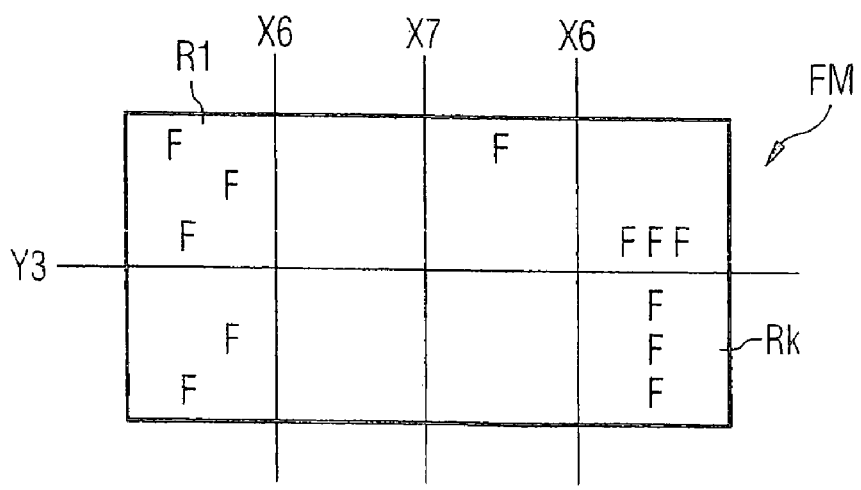

For a more detailed explanation FIGS. 4A and 4B schematically show an exemplary content of a fail memory after a test path in the memory and an associated exemplary compressed bit fail map, respectively. In this case, the row addresses Adr(X) are shown in simplified fashion by the row address bits X0 to X7, and the column addresses Adr(Y) are shown by the column address bits Y0 to Y3. In FIGS. 4A and 4B, as compared to FIG. 3, a relatively reduced address space is shown in order to be able to explain the relationships better. In the example shown in FIG. 4B, the "split bits" X6, X7, Y3 have been set to "1," which means that the address space is divided into $2^3=8$ address regions R1 to Rk.

Some of the regions R1 to Rk are used to register error data F, whereas others are not. Thus, a fail memory FM, as shown in FIG. 4B, obtained. The content of this fail memory FM is compressed in the compressed bit fail map CBFM as shown in FIG. 4A. In this context, each bit B1 to Bk in the compressed bit fail map CBFM is associated with a respective address region R1 to Rk, for example, the bit B1 is associated with the address region R1 and the bit Bk is associated with the address region Rk. The bits B1 to Bk can register an error data item F from a memory cell in the memory within the associated address region R1 to Rk. This means that, if at least one memory cell within an address region produces an error data item F, the associated bit within the compressed bit fail map CBFM is assigned the value "1." A compressed bit fail map CBFM as shown in FIG. 4A is thus obtained for the fail memory shown in FIG. 4B.

The memory unit 7 shown in FIG. 1 is used to store compressed bit fail maps as shown in basic form in FIG. 4A. In this context, a group of data ports IO, which are repaired together and are combined by the IO compression module 4, has a respective decoder circuit 61, 62, 63, 64 and a respective memory unit 71, 72, 73, 74 associated with it. Each of the memory units 71, 72, 73, 74 is used to store a compressed bit fail map CBFM in line with the principle shown in FIG. 4A. Each of the bits in the compressed bit fail map registers an existing error data item from a memory cell in the memory within the associated address region. The respective decoder circuits 61, 62, 63, 64 receive the compressed address of the compression unit 5, which flags an address for an address region from which the test data item has been read. The respective decoder circuit 61, 62, 63, 64 is used to access that bit in the compressed bit fail map stored in the respective memory unit 71, 72, 73, 74, which is associated with the respective address region on the basis of the compressed address. In this context, the respective bits (for example, B1 to Bk in line with FIG. 4A) in the respective memory unit 71, 72, 73, 74 adopt the state "1", which flags the presence of an error data item F from a memory cell in the memory within the associated address region R1 to Rk, as soon as an error data item F has been recognized within the associated address region. This state is retained for the rest of a test.

In addition, the memory shown in FIG. 1 has a long-term memory unit 9 which is connected to the memory unit 7 via a combinational logic circuit 8. The long-term memory unit 9 provides long-term storage of the bits in a compressed bit fail map in corresponding bits in the long-term memory unit in order to form a "accumulated compressed bit fail map." Accordingly, respective long-term memory units 91, 92, 93, 94 are provided, which are associated with the individual memory units 71, 72, 73, 74. The combinational logic circuit 8 is in the form of an OR combinational logic circuit or a combinational logic circuit having the same effect. The combinational logic circuit 8 is used to OR each of the bits in the memory units 71, 72, 73, 74 with a corresponding bit in the long-term memory units 91, 92, 93, 94.

In addition, an evaluation circuit 10 is provided, which is connected to the memory unit 7 and to the long-term memory unit 9, in order to read the content of these memory units to the outside of the memory using the output signal A. In addition, respective setting circuits 12, 13, 14 are provided, which are actuated by external test mode signals TM1 to TM3. The evaluation circuit 10 is actuated by the external test mode signal TM4.

A method for operating the memory with an associated test circuit is described in relation to FIG. 1. At the start of a "test pattern", the setting circuit 14 with the associated test mode signal TM2 is used to reset the memory unit 7 and the long-term memory unit 9, so that each bit in the compressed bit fail map for the respective memory units is reset to the state "0." In addition, the activation signal ACT is forwarded to the setting circuit 13 in order to activate the compression unit 5, in particular. Separate activation is also possible using the test mode signal TM1. The setting circuit 12 can be used to set the register circuit 11 with "split bits." One alternative to this would be to program the register circuit 11 permanently in the design process, for example, by appropriately setting the programmable fuses which are associated with the register circuit 11, or by a metal mask.

During the test pattern pass, if an error data item from a memory cell in the memory is received, the compression unit 5 generates a compressed address for this error data item. Accordingly, the decoder circuit 6 is used to overwrite that bit in the memory unit 7, which is associated with the corresponding address region in which the error data item has been detected with a bit information item. If there is no error data item, the compression unit 5 does not transfer an address and the corresponding bit in the memory unit 7 continues to have the "0" assignment. If more than one error data item is detected for an address region, the corresponding bit in the compressed bit fail map, which has the "1" assignment, is overwritten with "1," so that the address region thus remains marked as being faulty. The OR combinational logic circuit 8 continues to combine the content of each individual bit in the memory unit 7 with the associated bit in the long-term memory unit 9, so that even with a plurality of test passes each error, once detected, within an address region remains marked with the state "1" in the long-term memory unit 9.

After the test pattern pass, one alternative is for the test mode signal TM1 to be set accordingly such that the compression unit 5 is deactivated. Another alternative is for the test mode signal TM4 to be used to activate the evaluation circuit 10 in order, following a test pass, to read the content of the memory unit 7, and hence the compressed bit fail map for the individual memory units 71, 72, 73, 74, to the outside of the memory for analysis purposes. Similarly, after a plurality of test pattern passes, the content of the long-term memory unit 9 can be read to the outside of the memory via the evaluation circuit 10 for analysis purposes. The evaluation circuit 10 can deactivate the setting circuit 13 using a deactivation signal dis and hence can deactivate the compression unit 5.

Figure 2:
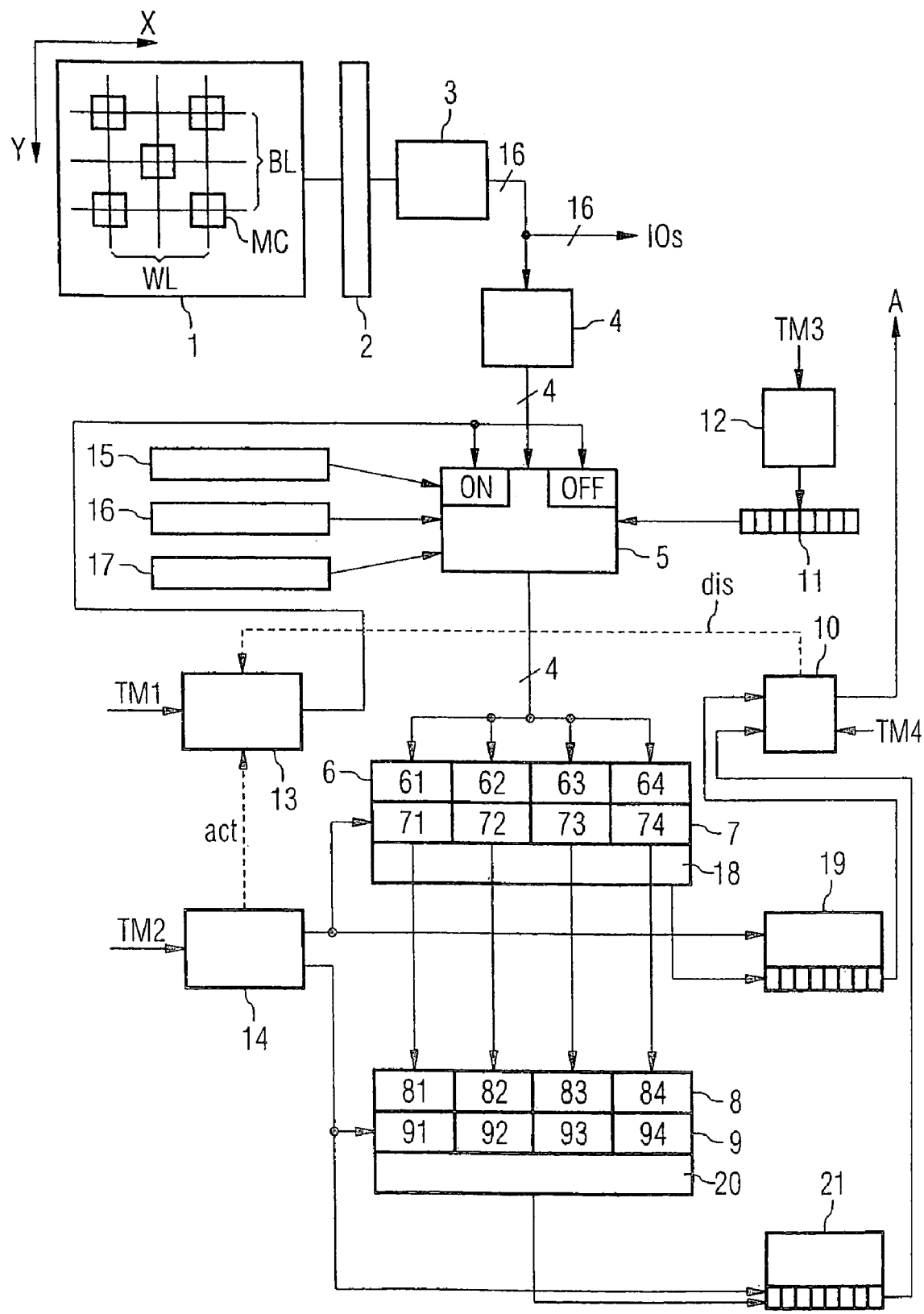
FIG. 2 shows a second embodiment of an integrated memory based on the invention with a circuit for testing the operation of the memory.

FIG. 2 shows another embodiment of an integrated memory based on the invention with a circuit for testing the operation of the memory. In comparison with the circuit shown in FIG. 1, the circuit shown in FIG. 2 also has additional components, the other components in comparison with FIG. 1 having been retained and being provided with the same reference symbols.

In the embodiments shown in FIG. 2, there is also a counter controller 18 which actuates a counter circuit 19. The counter circuit 19 is connected to the evaluation circuit 10 and can be read to the outside of the memory via this evaluation circuit. The counter circuit 19 is used, together with the counter controller 18, to count the number of those bits in the compressed bit fail map which are stored in the memory unit 7 and flag an error data item. Similarly, a further counter circuit 21 with an associated counter controller 20 is provided, which are connected to the long-term memory unit 9. The counter circuit 21 with the associated counter controller 20 are used to count the number of those bits in the accumulated compressed bit fail map for the long-term memory unit 9 which flag an error data item.

Each of the counter circuits 19 and 21 can be reset via the setting circuit 14. Using the counter circuits 19 and 21, an information item can be read from a test pattern or from a plurality of test patterns faster than evaluating the individual compressed bit fail maps. In this context, however, embodiments shown in FIGS. 1 and 2 can be combined so that optionally either the individual compressed bit fail maps or the information contained in the counter circuits are read. In this context, the counter circuits 19, 21 represent an independent evaluation tool, however, which can be used, for example, in practice to reduce test time.

A further test mode can be generated, which can be used to check an integrated memory's test circuits shown in FIGS. 1 and 2. To this end, the memory units 7, 9 are first reset. Next, a "0", for example, is written to the memory units 7, 9, so that during correct operation the individual bits likewise store "0" as the result. A "1" is then written to the memory units 7, 9 and read again in the same cycle. The result from the counter circuits 19, 21 reflect the number of address regions represented in the memory units 7 and 9 (in the case of a register circuit 11 with preassignments as shown in FIG. 3: $2^{10} \cdot 4 = 4096$ address regions).

This test pass can be modified such that first the bit sequence "10101 . . . 10" is written and then read, with the result from the counter circuits needing to show half of the number of address regions (in the example 2048). The same applies to the bit sequence "01010 . . . 01"

The above description of the exemplary embodiments in line with the present invention serves merely for illustrative purposes and not to limit the invention. The invention allows various changes and modifications without departing from the scope of the invention and its equivalents.

LIST OF REFERENCE SYMBOLS

1 Memory cell array
2 Sense amplifier
3 Output register
4 IO Compression module
5 Compression unit
6 Decoder circuit
7 Memory unit
8 Combinational logic circuit
9 Long-term memory units
10 Evaluation circuit
11 Registered circuit
12 Setting circuit
13 Setting circuit
14 Setting circuit
15 Row address multiplexer
16 Memory bank controller
17 Column decoder
18 Counter controller
19 Counter circuit
20 Counter controller
21 Counter circuit
61-64 Decoder circuit
71-74 Memory unit
81-84 Combinational logic circuit
91-94 Long-term memory unit
111 Row register
112 Column register
TM1-TM4 Test mode signal
A Output signal
WL Word lines
BL Bit lines
MC Memory cells
X row
Y Column
CBFM Compressed bit fail map
FM Fail memory
X0-Xn Row address bit
Y0-Yn Column address bit
Adr Address
act Activation signal
dis Deactivation signal
R1-Rk Address region
B1-Bk Bit
F Error data item
IO Data port

I claim:

1. An integrated memory having a function test for the integrated memory, comprising:
 a memory cell array having memory cells for storing test data;
 a plurality of circuit components for reading the test data from the memory cells;

a plurality of circuit components for ascertaining addresses for the memory cells from which the test data have been read;

a compression module connected to the circuit components for reading the test data from the memory cells, the compression module receiving the test data from the memory cells, the compression module performing a nominal/actual data comparison with the received test data from the memory cells and producing an associated error data item at the output for a test data item from the test data from one of the memory cells if the one test data item from the test data from the one of the memory cells differs from a nominal data item which is associated with the one of the memory cells;

a register circuit for storing a bit combination, which can be used to divide an address space in the memory into address regions having a respective plurality of associated memory cells;

a compression unit receiving error data which have been produced by the output of the compression module, the compression unit being actuated by the register circuit, the compression unit generating a compressed address from the address of a received error data item from the error data, the compressed address flagging an address for one of the address regions from which the test data item associated with the received error data item has been read;

a memory unit for storing a plurality of bits, each of the bits being associated with one of the address regions, and the bit associated with one of the address regions being set if the error data item produced by the compression module belongs to a test data item from the test data which is associated with the one of the address regions;

a decoder circuit connected to the compression unit and to the memory unit, the decoder circuit receiving the compressed address and accessing that bit in the memory unit, which is associated with the respective address region based on the compressed address;

a long-term memory unit, the long-term memory unit being connected to the memory unit, the long-term memory unit for long-term storage of the bits in the memory unit in corresponding bits in the long-term memory unit; and a combinational logic circuit to combine each of the bits in the memory unit with a corresponding bit in the long-term memory unit.

2. The integrated memory as claimed in claim 1, wherein the respective bits in the memory unit adopt a state which flags the presence of an error data item from a memory cell in the memory within the associated address region when an error data item has been recognized within the associated address region and retain this state.

3. The integrated memory as claimed in claim 1, further comprising:

an evaluation circuit, the evaluation circuit connected to the memory unit, the evaluating circuit reading the memory unit to the outside of the memory.

4. The integrated memory as claimed in claim 1, further comprising:

a counter circuit connected to the memory unit, the counter circuit can be read to the outside, the counter circuit counting the number of those bits in the memory unit which flag an error data item.

5. The integrated memory as claimed in claim 1, wherein said combinational logic circuit includes an OR combinational logic circuit.

6. The integrated memory as claimed in claim 5, further comprising:

a second counter circuit which can be read to the outside, the second counter circuit being connected to the long-term memory unit, the second counter circuit counting the number of those bits in the long-term memory unit which flag an error data item.

7. The integrated memory as claimed in claim 1, wherein the memory has a plurality of data ports, a group of data ports being jointly associated with a respective decoder circuit and memory unit.

8. A method for operating an integrated memory cell array having memory cells for storing test data, circuit components for reading the test data from the memory cells, circuit components for ascertaining addresses for the memory cells from which the test data have been read, a compression module connected to the circuit components for reading the test data from the memory cells, the compression module receiving the test data from the memory cells, the compression module performing a nominal/actual data comparison with the received test data from the memory cells and producing an associated error data item at the output for a test data item from the test data from one of the memory cells if the one test data item from the test data from the one of the memory cells differs from a nominal data item which is associated with the one of the memory cells, a register circuit for storing a bit combination, which can be used to divide an address space in the memory into address regions having a respective plurality of associated memory cells, a compression unit receiving error data which have been produced by the output of the compression module, the compression unit being actuated by the register circuit, the compression unit generating a compressed address from the address of a received error data item from the error data, the compressed address flagging an address for one of the address regions from which the test data item associated with the received error data item has been read, a memory unit for storing a plurality of bits, each of the bits being associated with one of the address regions, and the bit associated with one of the address regions being set if the error data item produced by the compression module belongs to a test data item from the test data which is associated with the one of the address regions, a decoder circuit connected to the compression unit and to the memory unit, the decoder circuit receiving the compressed address and accessing that bit in the memory unit, which is associated with the respective address region based on the compressed address, and a long-term memory unit, the long-term memory unit being connected to the memory unit, the long-term memory unit for long-term storage of the bits in the memory unit in corresponding bits in the long-term memory unit, the method comprising:

in the event of an error data item from a memory cell in the memory being received, the compression unit generating a compressed address for this error data item; overwriting that bit in the memory unit which is associated with the corresponding address region in which the error data item has been detected with a bit information item by the decoder circuit; and combining each of the bits in the memory unit with a corresponding bit in the long-term memory unit via a combinational logic circuit.

9. The method as claimed in claim 8, further comprising:
after a test pass, reading the content of the memory unit to the outside of the memory for analysis purposes.

10. The method as claimed in claim 8, further comprising:
reading the content of the long-term memory unit to the outside of the memory for analysis purposes after a plurality of test passes have elapsed.

11. The integrated memory as claimed in claim 1, further comprising:
a second counter circuit which can be read to the outside, the second counter circuit being connected to the long-term memory unit, the second counter circuit counting the number of those bits in the long-term memory unit which flag an error data item.

* * * * *